(12) United States Patent
Haque et al.

(10) Patent No.: US 7,489,555 B2
(45) Date of Patent: Feb. 10, 2009

(54) PROGRAM-VERIFY SENSING FOR A MULTI-LEVEL CELL (MLC) FLASH MEMORY DEVICE

(75) Inventors: Rezaul Haque, Folsom, CA (US); Darshak Udeshi, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 8 days.

(21) Appl. No.: 11/767,257

(22) Filed: Jun. 22, 2007

(65) Prior Publication Data

US 2008/0316814 A1    Dec. 25, 2008

(51) Int. Cl.
    *G11C 16/34* (2006.01)
(52) U.S. Cl. ............................ 365/185.22; 365/185.2; 365/185.03; 365/185.11
(58) Field of Classification Search ............ 365/185.03, 365/185.11, 185.21, 185.22, 185.2, 185.09
    See application file for complete search history.

(56) References Cited

U.S. PATENT DOCUMENTS

| 5,306,963 | A | * | 4/1994 | Leak et al. ..................... 327/14 |
| 5,751,635 | A | * | 5/1998 | Wong et al. ............ 365/185.19 |
| 6,166,962 | A | * | 12/2000 | Chen et al. ............... 365/185.3 |
| 6,483,751 | B2 | * | 11/2002 | Chen et al. ............. 365/185.26 |

OTHER PUBLICATIONS

Product Brief, Intel NOR Flash Memory, "Intel Strataflash Cellular Memory (M18)", 2 pages.
Developer's Manual, Intel Strataflash Cellular Memory (M18), Nov. 2006, Order No. 315567-001US, 64 pages.

* cited by examiner

*Primary Examiner*—Andrew Q. Tran
(74) *Attorney, Agent, or Firm*—Trop, Pruner & Hu, P.C.

(57) ABSTRACT

During a program verify sensing operation, a tracking signal may be generated to match a sense amplifier signal. A data stream from a sequence generator may be held at a pass/hold logic until the tracking signal reaches a trip point. The data stream may be subsequently latched at a main latch with the sense amplifier signal.

12 Claims, 3 Drawing Sheets

PROGRAM-VERIFY SENSING FOR A MULTI-LEVEL CELL (MLC) FLASH MEMORY DEVICE

BACKGROUND

Generally, to program a multi-level cell (MLC) flash memory device, program and program verify operations are needed. A program verify operation may include an address decode operation, a sensing operation, and a data resolving operation. In a conventional MLC program verify sensing operation, data is generated by an address transition detector (ATD) circuit. The data gets latched by the output of a sense amplifier, which generates the control signal for the latching operation. The data generated by the ATD is latched when the sense amplifier changes state.

The output of the sense amplifier is set to a pre-determined state at the beginning of the sense operation. When the sense amplifier changes state, indicating that the data generated by ATD needs to be latched, the sense amplifier signal is transmitted on a metal line through the entire flash memory array to a peripheral latch logic. The sense amplifier control signal transmitted to the peripheral latch logic will be termed "VBUS" herein. VBUS latches the data present at the input of the latch logic, and passes it to output buffers.

Since a single VBUS signal is shared between sense amplifiers in every partition and is routed through the core, the signal path is very long and also narrow. If a sense amplifier nearest the peripheral latch logic trips, the VBUS has less resistance and capacitance in the path, and latches the data with minimum delay. A sense amplifier farther from the peripheral latch logic will take a longer time to transmit VBUS from the sense amplifier to the peripheral latch logic. If the variance in ramp times of VBUS is not accurately matched with the data being generated by ATD, it is possible to latch incorrect data during the program verify operation.

In a conventional MLC program verify scheme, a fixed time interval 108 is allocated to every sense outcome after modeling the VBUS path 102, as illustrated in FIG. 1. ATD generates an incoming data stream 104 used to latch three possible outcomes, (11, 10, 00). The outcomes are equally spaced in time. However, the VBUS response 106 will change based on supply voltage, temperature, and process, while the ATD response is supply voltage and process independent. Thus, in some cases when a fast verify operation is initiated, incorrect data could be latched, forcing the usage of a slow verify operation which in turn impacts overall program performance.

BRIEF DESCRIPTION OF THE DRAWINGS

A better understanding of embodiments of the present invention can be obtained from the following detailed description in conjunction with the following drawings, in which.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure an understanding of this description.

References to "one embodiment," "an embodiment," "example embodiment," "various embodiments," etc., indicate that the embodiments) of the invention so described may include particular features, structures, or characteristics, but not every embodiment necessarily includes the particular features, structures, or characteristics. Further, some embodiments may have some, all, or none of the features described for other embodiments.

In the following description and claims, the terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

As used in the claims, unless otherwise specified the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

When programming a cell in a multi-level cell (MLC) flash memory device, it may be necessary to verify if the programmed cell has reached the desired threshold voltage, Vt. A program verify operation may be performed to determine if the cell was programmed to the correct Vt. The program verify operation may include an address decode operation, a sensing operation that may require multiple sense cycles, and a data resolving operation. Embodiments described herein may be part of a program verify sensing operation.

Figure 1:
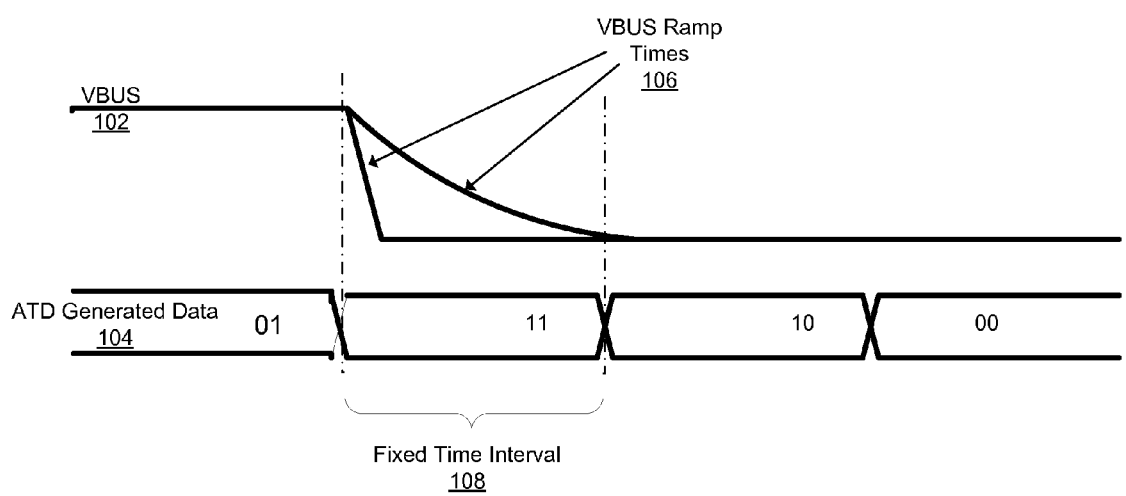
FIG. 1 is a timing diagram illustrating a conventional program verify sensing scheme according to some embodiments.
Figure 2:
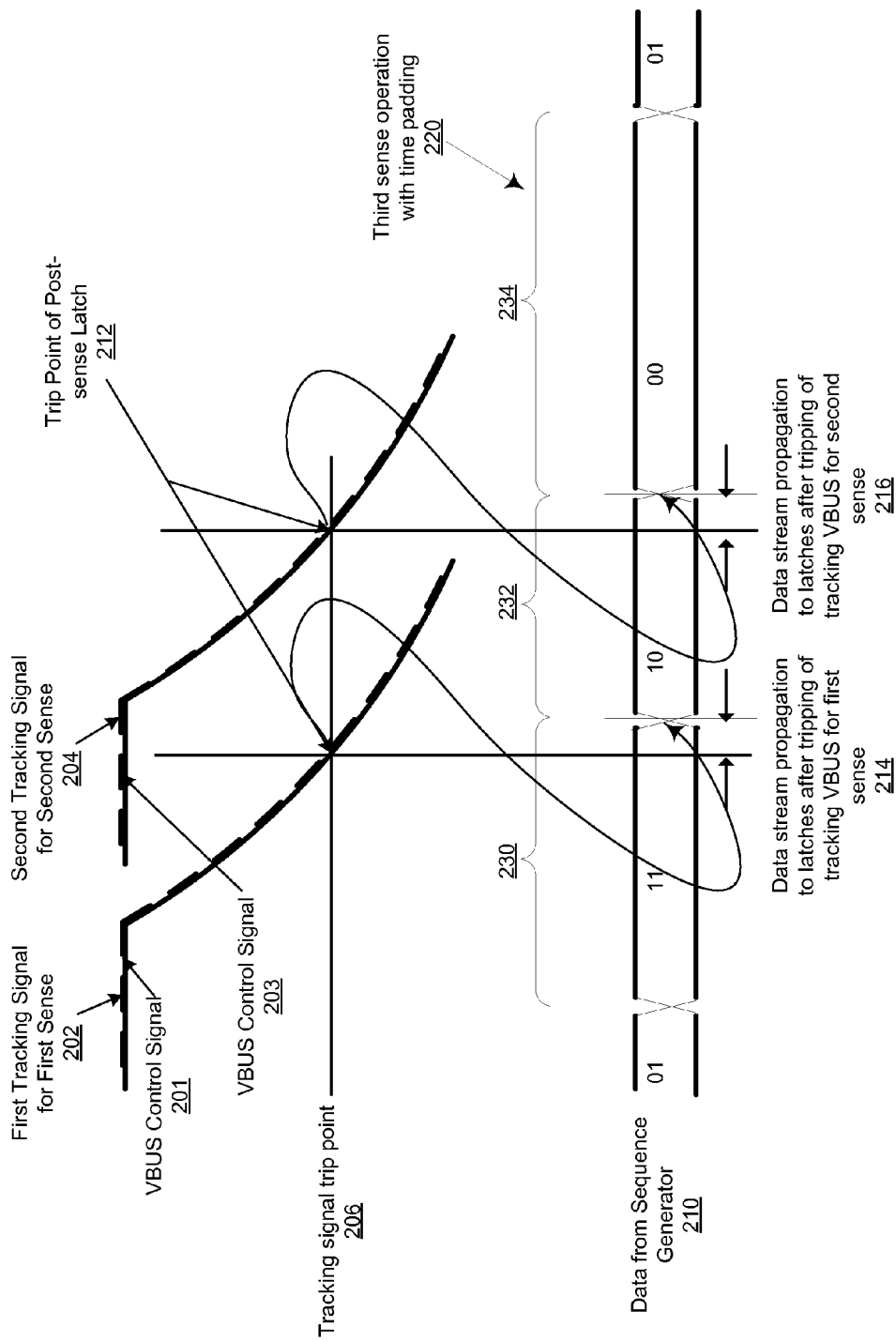
FIG. 2 is a timing diagram illustrating a program verify sensing scheme utilizing tracking signals to hold data according to some embodiments.

FIG. 2 is a timing diagram illustrating a program verify sensing scheme utilizing tracking signals to hold data according to some embodiments. The program verify sensing operation may require three cycles, 230, 232, 234. When a sense amplifier for a partition trips during a first cycle, indicating that data needs to be latched, a VBUS control signal 201 is generated. At the same time, a dummy sense amplifier in the same partition is tripped, generating a tracking signal 202 that matches the control signal 201. In some embodiments, the tracking signal routing on the die may be the same size, shape, and metal type as the VBUS signal. The tracking signal 202 may accurately model the fall time of the control signal 201.

When the first tracking signal 202 reaches a predetermined value, or trip point, 206, data generated by a sequence generator 210 is released from pass/hold gates, and propagates to latches 214. The data can then be latched by the VBUS control signal 201. Use of the tracking signal to hold the data 210 generated by a sequence generator until the VBUS control signal is ready to latch it ensures that the data 210 won't be changed until the tracking signal 202 falls. This enables the correct data to be latched reliably regardless of sense amplifier location (e.g., far from peripheral logic) or temperature, voltage, or process variation. Thus, an address transition detector circuit (ATD) does not need to generate separate events to generate the data stream 104, and further doesn't need to keep track of the supply voltage, temperature, and process sensitivity of the sense operation.

Similarly, for a second sense cycle 232 in a program verify operation, when a sense amplifier for a partition trips, indicating that data needs to be latched, a VBUS control signal 203 is generated. At the same time, a dummy sense amplifier in the same partition is tripped, generating a tracking signal 204 that is identical to the control signal 203. The tracking signal 204 may accurately model the fall time of the control signal 203. When the second tracking signal 204 reaches a predetermined value, or trip point, 206, data generated by a sequence generator 210 is released from pass/hold gates, and propagates to latches 216. The data can then be latched by the VBUS control signal 203.

In some embodiments, the trip point 206 for the tracking signals 202, 204 may be set at any point between 10% and 90% of the signal range for the tracking signals. In some embodiments, the signal range may be from 0V to Vcc, which may be between 1.65 and 2.0V. In some embodiments, the trip point may be set at approximately 50% of Vcc.

The VBUS signals and tracking signals may be minimally spaced through the flash device core to save die area. This may cause coupling between the signals. To prevent latching of incorrect data due to coupling effects, the third cycle of the sense operation 234 may be given additional time 220 to latch the data. In some embodiments, the third cycle of the sense operation may have a duration of approximately 40-50 nanoseconds, or may be approximately 20-30 ns longer than the first or second cycle. Because the additional time 220 provided for the third sense cycle is adequate to compensate for process, temperature, and Vcc sensitivity of the control signal sense amplifier, no tracking signal may be required for the third cycle of the sense operation.

In some embodiments, each cycle of the sense operation 230, 232, 234 may have a different duration. The duration of the first cycle 230 and second cycle 232 may be non-fixed, and may depend on when the tracking signal 202, 204 reaches a trip point. The duration of the third cycle 234 may be sufficient to prevent incorrect latching due to coupling effects.

Figure 3:
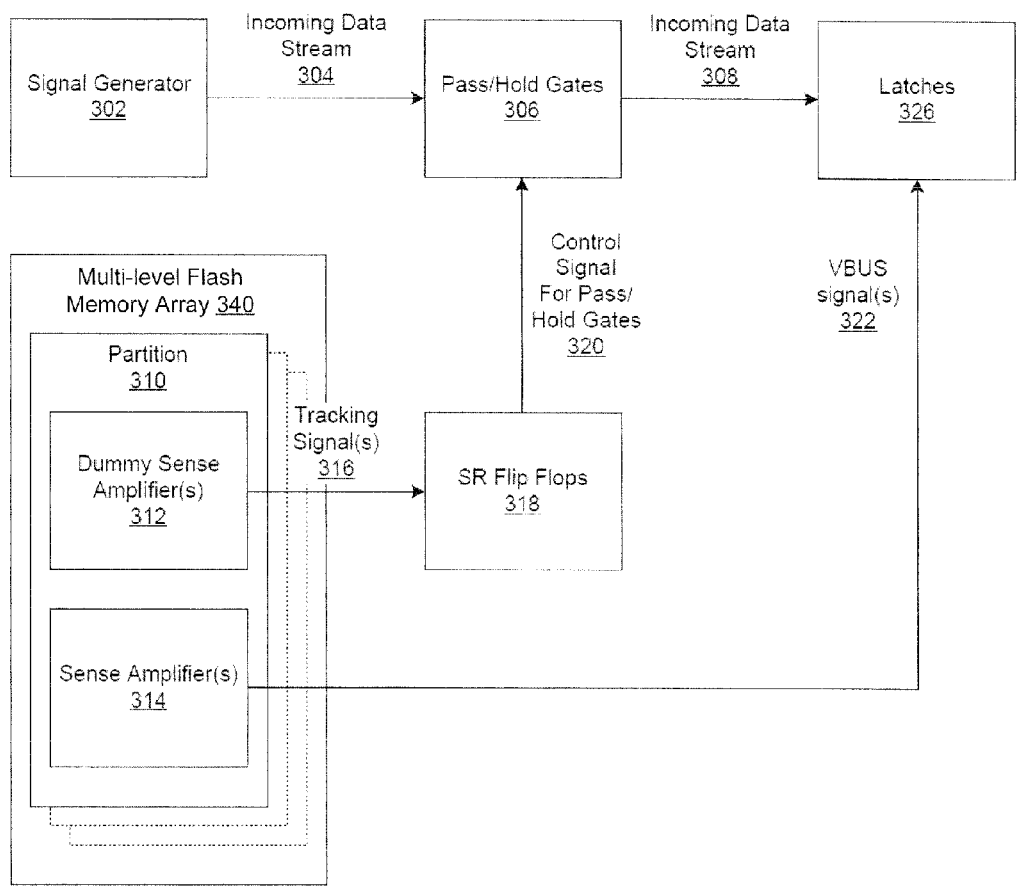
FIG. 3 is a block diagram of a control path for a multi-level cell program verify sensing scheme utilizing tracking signals according to some embodiments.

FIG. 3 is a block diagram of a control path for a multi-level cell program verify sensing scheme utilizing tracking signals according to some embodiments. An array of multi-level flash memory cells 340 may be divided into a plurality of partitions 310, each partition including a plurality of memory cells. Each partition may include one or more sense amplifiers 314 to generate a control signal during a cycle of a program verify sense operation. For a sense operation having three cycles, the partition may include three sense amplifiers 314. The sense amplifiers may generate a control signal, VBUS 322, used to latch data during the sense operation.

Each partition may further include one or more dummy sense amplifiers 312. The dummy sense amplifiers 312 may generate a tracking signal 316 that is identical to the control signal 322 generated by the sense amplifiers 314. For a sense operation having three cycles, the partition may include two dummy sense amplifiers 314, one dummy sense amplifier to generate a tracking signal 316 for each of the first two cycles. No dummy sense amplifier may be necessary to generate a tracking signal for the third cycle if the third cycle has an adequate length, as described above.

A signal generator 302 may be coupled to the array 340. The signal generator 302 may generate an incoming data stream 304 for the sense operation. The incoming data stream 304 may be held at a logic block 306 until the tracking signal 316 reaches a trip point. In some embodiments, the logic block 306 may include one or more pass/hold gates.

A logic block 318 that is coupled to the array 340 may be used to determine when the tracking signal 316 has reached the predetermined trip point. In some embodiments, the logic block 318 may include set/reset (SR) flip flops. When the tracking signal hits the trip point, the logic block 318 generates a control signal 320 to pass the data stream 304 from the pass/hold gates. The data stream 308 is then latched at latches 326 by the VBUS control signal 322.

Thus, program verify sensing for a multi-level cell (MLC) flash memory device is disclosed in various embodiments. In the above description, numerous specific details are set forth. However, it is understood that embodiments may be practiced without these specific details. In other instances, well-known circuits, structures, and techniques have not been shown in detail in order not to obscure the understanding of this description. Embodiments have been described with reference to specific exemplary embodiments thereof. It will, however, be evident to persons having the benefit of this disclosure that various modifications and changes may be made to these embodiments without departing from the broader spirit and scope of the embodiments described herein. The specification and drawings are, accordingly, to be regarded in an illustrative rather than a restrictive sense.

We claim:

1. A method comprising:
    generating a first tracking signal to match a first sense amplifier signal during a first sense operation of a program verify operation;
    holding a data stream from a sequence generator at a pass/hold logic until the first tracking signal reaches a trip point; and
    subsequently latching the data stream at a main latch with the first sense amplifier signal.

2. The method of claim 1, further comprising generating a second tracking signal to match a second sense amplifier signal during a second sense operation of the program verify operation, holding the data stream from the sequence generator at the pass/hold logic until the second tracking signal reaches a trip point, and subsequently latching the data stream at the main latch with the second sense amplifier signal.

3. The method of claim 2, wherein generating the first tracking signal comprises generating the first tracking signal using a first dummy sense amplifier and wherein generating the second tracking signal comprises generating the second tracking signal using a second dummy sense amplifier.

4. The method of claim 2, further comprising performing a third sense operation of the program verify operation, wherein no tracking signal is generated.

5. The method of claim 4, wherein the third sense operation has a duration of between 40 and 50 nanoseconds.

6. The method of claim 1, wherein the trip point is set to a value between 10% and 90% of a Vcc voltage.

7. An apparatus comprising:
    an array of multi-level flash memory cells, the array divided into a plurality of partitions, each partition having a first sense amplifier to generate a first control signal for a latching operation and a first dummy sense amplifier to generate a first tracking signal for the first control signal;
    a first logic block coupled to the array, the first logic block to generate a second control signal based on the tracking signal;
    a second logic block coupled to the array, the second logic block to receive an incoming data stream and to hold the incoming data stream until the second control signal is received; and
    a third logic block coupled to the array, the third logic block to latch the incoming data stream using the first control signal.

8. The apparatus of claim 7, wherein each partition further includes a second sense amplifier to generate a third control signal and a second dummy sense amplifier to generate a second tracking signal for the third control signal.

9. The apparatus of claim 7, further comprising a signal generator coupled to the array to generate the incoming data stream.

10. The apparatus of claim 7, wherein the first logic block includes set/reset flip flops.

11. The apparatus of claim 7, wherein the second logic block includes pass/hold gates.

12. The apparatus of claim 7, wherein the third logic block includes latches.

\* \* \* \* \*